United States Patent
Cheon et al.

(10) Patent No.: US 12,550,256 B2
(45) Date of Patent: Feb. 10, 2026

(54) ELECTRONIC DEVICE HAVING PAD STRUCTURE

(71) Applicant: SAMSUNG ELECTRONICS CO., LTD., Suwon-si (KR)

(72) Inventors: Hansu Cheon, Suwon-si (KR); Youngjae Ko, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 306 days.

(21) Appl. No.: 18/381,942

(22) Filed: Oct. 19, 2023

(65) Prior Publication Data

US 2024/0049387 A1 Feb. 8, 2024

Related U.S. Application Data

(63) Continuation of application No. PCT/KR2022/003068, filed on Mar. 4, 2022.

(30) Foreign Application Priority Data

Apr. 19, 2021 (KR) .......................... 10-2021-0050696

(51) Int. Cl.
  *H05K 1/11* (2006.01)
  *G04G 17/04* (2006.01)
(52) U.S. Cl.
  CPC ............. *H05K 1/111* (2013.01); *G04G 17/04* (2013.01); *H05K 2201/0939* (2013.01); *H05K 2201/10128* (2013.01)
(58) Field of Classification Search
  CPC ........... H05K 1/111; H05K 2201/0939; H05K 2201/10128; G04G 17/04

(Continued)

(56) References Cited

U.S. PATENT DOCUMENTS

2004/0020972 A1  2/2004  Miyajima
2009/0046020 A1  2/2009  Kato et al.
(Continued)

FOREIGN PATENT DOCUMENTS

JP         6-13171 A      1/1994
JP     2004-63864 A      2/2004
(Continued)

OTHER PUBLICATIONS

International Search Report (PCT/ISA/210) issued by the International Searching Authority on Jun. 16, 2022 in corresponding International Application No. PCT/KR2022/003068.

(Continued)

*Primary Examiner* — Binh B Tran
(74) *Attorney, Agent, or Firm* — Sughrue Mion, PLLC

(57) ABSTRACT

An electronic device includes a housing; a printed circuit board provided in the housing and including a fastening hole; a pad structure provided on the printed circuit board, the pad structure including: a first pad surrounding at least a portion of the fastening hole; a second pad spaced apart from the first pad in a first direction; and a third pad spaced apart from the first pad in a second direction that is different from the first direction with respect to the fastening hole; a first electronic component provided on the printed circuit board and electrically connected to the second pad; and a metal plate including: a first plate area provided on the first pad; and a second plate area extending from the first plate area and provided on one of the second pad and the third pad.

15 Claims, 7 Drawing Sheets

(58) Field of Classification Search
USPC ........................................................ 361/767
See application file for complete search history.

(56) References Cited

U.S. PATENT DOCUMENTS

| | | | |
|---|---|---|---|
| 2014/0043192 A1 | 2/2014 | Park et al. | |
| 2014/0270917 A1 | 9/2014 | Malek | |
| 2014/0345918 A1* | 11/2014 | Rasp | H05K 1/0296 |
| | | | 174/250 |
| 2016/0064810 A1 | 3/2016 | Smith et al. | |
| 2016/0252887 A1 | 9/2016 | Namiki | |
| 2017/0094818 A1 | 3/2017 | Kim et al. | |
| 2017/0171960 A1 | 6/2017 | Yang | |
| 2017/0303389 A1 | 10/2017 | Motohashi et al. | |
| 2019/0196412 A1 | 6/2019 | Jung et al. | |

FOREIGN PATENT DOCUMENTS

| | | |
|---|---|---|
| JP | 2005-6097 A | 1/2005 |
| JP | 2005-348136 A | 12/2005 |
| KR | 10-2014-0022509 A | 2/2014 |
| KR | 10-2015-0115586 A | 10/2015 |
| KR | 10-2017-0036360 A | 4/2017 |
| KR | 10-2017-0068938 A | 6/2017 |
| KR | 10-2019-0076299 A | 7/2019 |
| KR | 10-2021-0015460 A | 2/2021 |

OTHER PUBLICATIONS

Written Opinion (PCT/ISA/237) issued by the International Searching Authority on Jun. 16, 2022 in corresponding International Application No. PCT/KR2022/003068.
Communication issued May 13, 2025 by the Korean Intellectual Property Office in Korean Patent Application No. 10-2021-0050696.
Communication dated Sep. 10, 2024, issued by European Patent Office in European Patent App. 22791875.2.

* cited by examiner

ELECTRONIC DEVICE HAVING PAD STRUCTURE

CROSS-REFERENCE TO RELATED APPLICATIONS

This application is by-pass continuation application of International Application No. PCT/KR2022/003068, filed on Mar. 4, 2022, which based on and claims priority to Korean Patent Application No. 10-2021-0050696, filed on Apr. 19, 2021, in the Korean Intellectual Property Office, the disclosures of which are incorporated by reference herein in their entireties.

BACKGROUND

1. Field

The disclosure relates to an electronic device including a pad structure.

2. Description of Related Art

Electronic devices may refer to devices that perform specific functions based on embedded programs, such as home appliances, electronic notes, portable multimedia players (PMPs), mobile communication terminals, tablet personal computers (PCs), video/audio devices, desktop/laptop computers, vehicle navigation systems, and so forth. For example, these electronic devices may output stored information in the form of sound or images. With the increasing integration of electronic devices and the common use of ultra-high-speed and large-volume wireless communication, various functions have recently come to be provided in a single electronic device, such as a mobile communication terminal. For example, various functions such as an entertainment function such as gaming, a multimedia function such as music/video playback, a communication and security function for mobile banking, and a function such as a schedule management or electronic wallet, as well as a communication function have been integrated into a single electronic device. Such electronic devices have become compact such that users can conveniently carry and wear them. With development of electronic/communication technologies, such electronic devices have become compact/lightweight such that they can be used without any inconvenience even when worn on the body.

Electronic devices having communication functions, such as portable terminals, have become increasingly miniaturized and lightweight to maximize user portability and convenience, and have been equipped with integrated components in gradually smaller spaces to achieve high performance.

Various electronic components may be mounted on a printed circuit board. For example, the frequency bands used by the electronic components may be changed based on the communication method of the electronic device (e.g., Bluetooth, 4G communication, or 5G communication) or the carrier of the electronic device. The printed circuit board may include a communication circuit that utilizes a plurality of communication methods and/or a plurality of frequency bands. The communication circuit of the printed circuit board may include wiring and/or electronic components to which a communication signal is applied, for example, such as electronic components for antenna tuning. However, the usage of the communication circuit of the printed circuit board may vary depending on the used communication methods and/or frequency bands, and interference between electronic devices or stub wiring may generate noise, leading to a degradation of communication quality.

There may be a need for indications to reflect information about the wiring or electronic components used in communication. For example, separate devices or screens can be utilized to display electronic component version information.

SUMMARY

Provided is an electronic device that may be capable of displaying information that reflects components mounted on a printed circuit board.

Further, provided is an electronic device that may have improved communication quality.

Additional aspects will be set forth in part in the description which follows and, in part, will be apparent from the description, or may be learned by practice of the presented embodiments.

According to an aspect of the disclosure, an electronic device includes: a housing; a printed circuit board provided in the housing and including a fastening hole; a pad structure provided on the printed circuit board, the pad structure including: a first pad surrounding at least a portion of the fastening hole; a second pad spaced apart from the first pad in a first direction; and a third pad spaced apart from the first pad in a second direction that is different from the first direction with respect to the fastening hole; a first electronic component provided on the printed circuit board and electrically connected to the second pad; and a metal plate including: a first plate area provided on the first pad; and a second plate area extending from the first plate area and provided on one of the second pad and the third pad.

The electronic device may further include a first communication module electrically connected to the first electronic component and configured to communicate, in a first frequency band, with an outside of the electronic device.

The second plate area may be bonded to the second pad, and the metal plate may be electrically connected to the first electronic component.

The electronic device may further include: a second electronic component provided on the printed circuit board and electrically connected to the third pad; and a second communication module configured to communicate, in a second frequency band, with the outside of the electronic device, wherein the second frequency band may be different from the first frequency band.

The second plate area may be bonded to the third pad, and the metal plate may be electrically connected to the second electronic component.

The electronic device may further include a side bezel structure electrically connected to the metal plate.

The pad structure may include a fourth pad spaced apart from the first pad in a third direction that is different from the first direction and the second direction with respect to the fastening hole.

The first pad may include a (1-1)th pad, a (1-2)th pad, a (1-3)th pad, and a (1-4)th pad, which are spaced apart from each other.

The first plate area may have a closed curve shape, and the second plate area may protrude from the first plate area.

The printed circuit board may include a display member visually exposed to an outside of the printed circuit board, and the display member may include a first display member adjacent to the second pad, and a second display member adjacent to the third pad.

The metal plate may include at least one of stainless steel and aluminum.

The electronic device may further include a fastening member at least partially disposed in the fastening hole, and at least a portion of the fastening member may be surrounded by the metal plate.

At least a portion of the metal plate may be between the fastening member and the pad structure.

The electronic device may further include: a display; and a support member provided in the housing and between the display and the printed circuit board, and the printed circuit board may be connected to the support member by the fastening member.

The electronic device may further include at least one binding member detachably connected to the housing.

According to one or more embodiments of the disclosure, a printed circuit board may display information that reflects the components mounted on the printed circuit board using a metal plate. For example, the wiring and/or electronic components mounted on the printed circuit board may be changed based on the used communication method and/or frequency band, and the printed circuit board may display information reflecting the wiring and/or electronic components. As a result, this may enhance convenience in assembling the electronic device.

According to one or more embodiments of the disclosure, a metal plate may be electrically connected to a second pad, which is connected to a first electronic component for communication in a first frequency band, or a third pad, which connected to a second electronic component for communication in a second frequency band. Accordingly, it may be possible to reduce the noise of the electronic device, and improve a communication quality of the electronic device.

BRIEF DESCRIPTION OF THE DRAWINGS

The above and other aspects, features, and advantages of specific embodiments of the present disclosure will be more apparent from the following description with reference to the accompanying drawings, in which.

DETAILED DESCRIPTION

Figure 1:
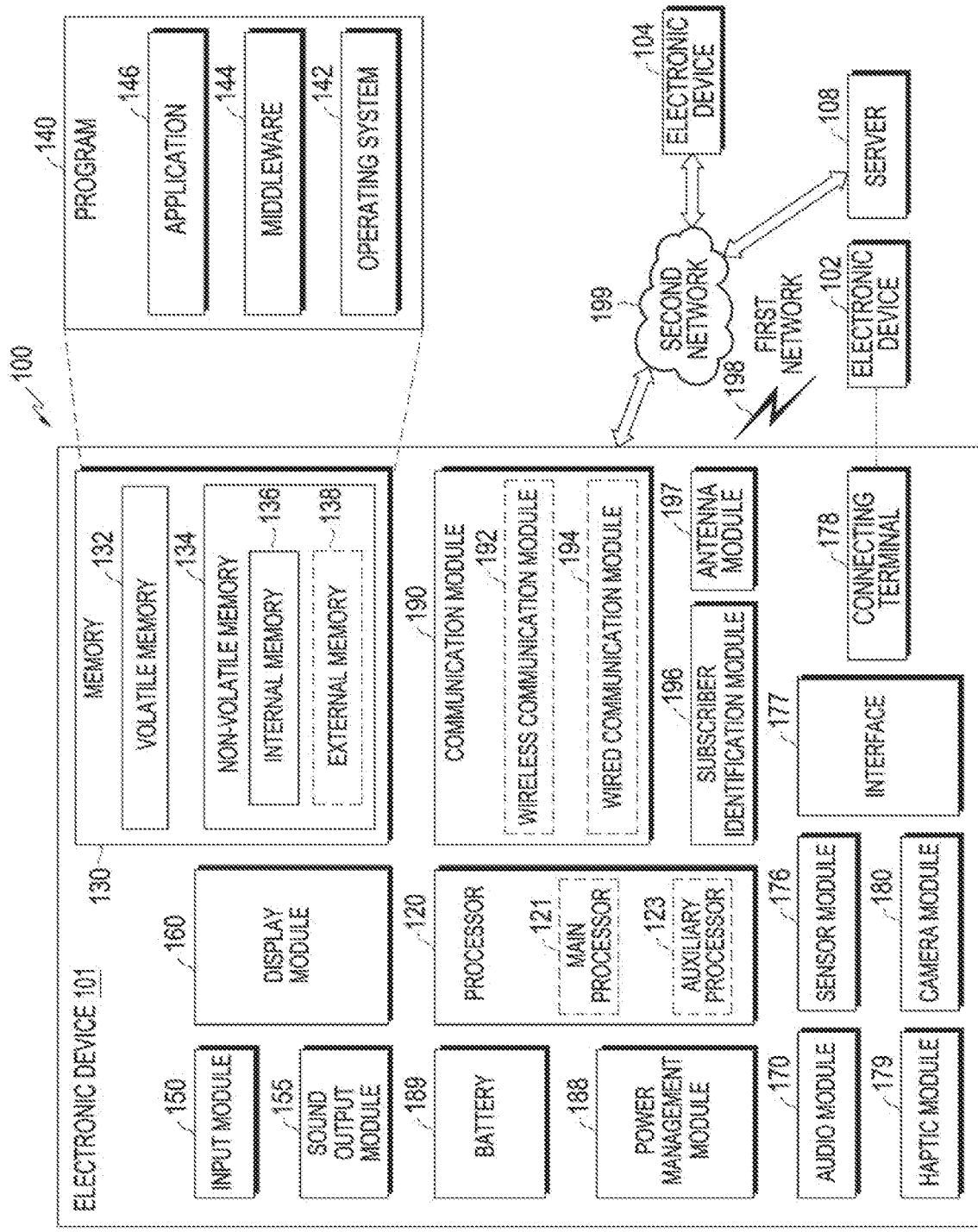
FIG. 1 is a block diagram of an electronic device in a network environment according to embodiments of the disclosure.

FIG. 1 is a block diagram illustrating an electronic device in a network environment 100 according to various embodiments of the disclosure.

Referring to FIG. 1, the electronic device 101 in the network environment 100 may communicate with at least one of an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In an embodiment, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160). The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for deep learning model processing. The deep learning model may be generated via machine learning. Such learning may be performed, e.g., by the electronic device 101 where the deep learning model is performed or via a separate server (e.g., the server 108). Learning algorithms may include, but are not limited to, e.g., supervised learning, unsupervised learning, semi-supervised learning, or reinforcement learning. The deep learning model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The deep learning model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an accelerometer, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module 197 may include one antenna including a radiator formed of a conductive body or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) there between via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "$1^{st}$" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
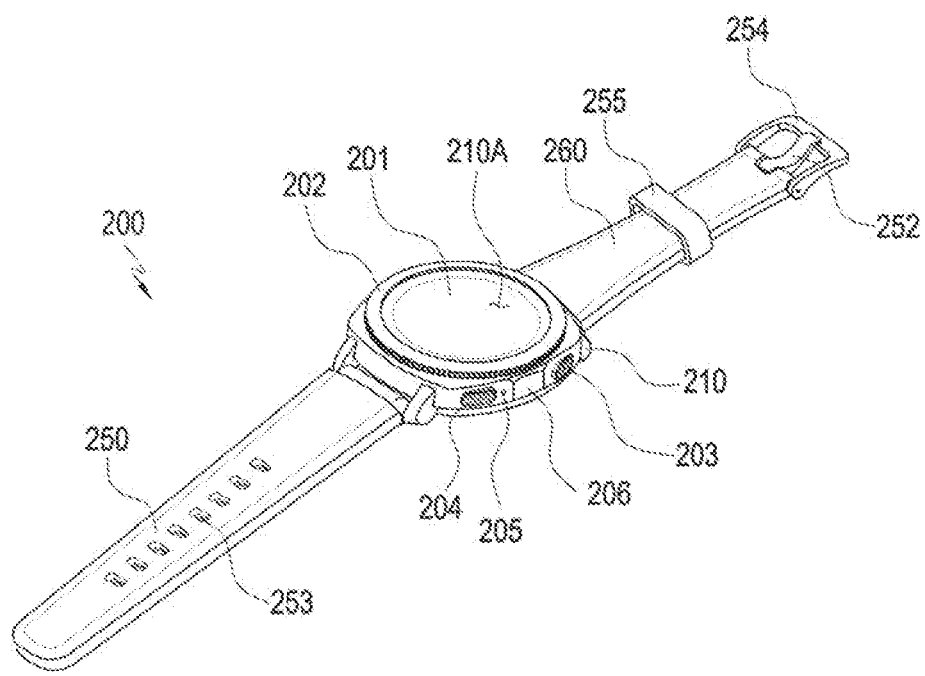
FIG. 2 is a front perspective view illustrating an electronic device according to embodiments of the disclosure.
Figure 3:
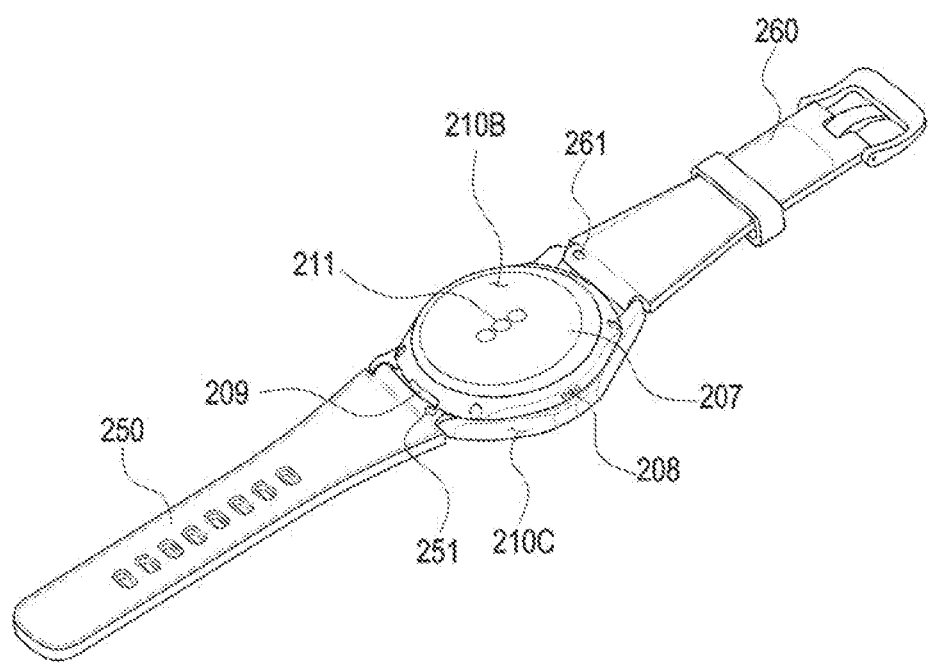
FIG. 3 is a rear perspective view of the electronic device of FIG. 2.

FIG. 2 is a front perspective view illustrating an electronic device according to various embodiments, and FIG. 3 is a rear perspective view of the electronic device of FIG. 2.

Referring to FIG. 2 and FIG. 3, an electronic device 200 is a watch-type electronic device, allowing users to wear the electronic device 200. For example, the electronic device 200 may be a smart watch or a wearable electronic device that may be worn on the user's wrist.

The electronic device 200 according to an embodiment may include a housing 210 including a first surface (or front surface) 210A, a second surface (or rear surface) 210B, and a side surface 210C surrounding a space between the first surface 210A and the second surface 210B, binding member 250, and binding member 260 connected to at least a portion of the housing 210 and configured to removably bind the electronic device 200 on a portion of a user's body (e.g., a wrist, an ankle, etc.).

In another embodiment, a housing may refer to a structure forming part of the first surface 210A, the second surface 210B, and the side surface 210C. According to an embodiment, at least a portion of the first surface 210A may be formed by a substantially transparent front plate 201 (e.g., a glass plate or a polymer plate including various coating layers). The second surface 210B may be formed by a substantially opaque rear plate 207. The rear plate 207 may be formed of, for example, coated or colored glass, ceramic, polymer, metal (e.g., aluminum, stainless steel (STS), or magnesium), or a combination of two or more of these materials. The side surface 210C may be formed by a side bezel structure 206 (or a "side member") coupled to the front plate 201 and the rear plate 207 and including metal and/or polymer. In some embodiments, the rear plate 207 and the side bezel structure 206 may be integrally configured, and may include the same material (e.g., a metal material such as aluminum). The binding member 250 and the binding member 260 may be formed of various materials and in various shapes. A plurality of integrated-type unit links may be formed to be movable with respect to each other using a woven material, leather, rubber, urethane, metal, ceramic, or a combination of two or more of these materials.

According to an embodiment, the electronic device 200 may include at least one of a display (e.g., the display 220 of FIG. 3), audio module 205, audio module 208, a sensor module 211, key input device 202, key input device 203, and key input device 204, and a connector hole 209. In some embodiments, in the electronic device 200, at least one of the components (e.g., the key input device 202, the key input device 203, and the key input device 204, the connector hole 209, or the sensor module 211) may be omitted, or other components may be additionally included.

The display 220 may be exposed through a significant portion of, for example, the front plate 201. The shape of the display 220 may have a shape corresponding to the shape of the front plate 201, and may have various shapes such as a circle, an ellipse, and a polygon. The display 220 may be coupled to or disposed adjacent to a touch sensing circuit, a pressure sensor capable of measuring touch intensity (pressure), and/or a fingerprint sensor.

The audio module 205 and the audio module 208 may include a microphone hole and a speaker hole. The microphone hole may include a microphone disposed therein to acquire external sound, and in some embodiments, a plurality of microphones may be disposed therein to be able to detect the direction of sound. The speaker hole may be used for an external speaker and a call receiver. In some embodiments, the speaker hole 207, the speaker hole 214, and the microphone hole 203 may be implemented as a single hole, or a speaker may be included without the speaker hole 207 and the speaker hole 214 (e.g., a piezo speaker).

The sensor module 211 may generate electrical signals or data values corresponding to the internal operating states or the external environmental states of the electronic device 200. The sensor module 211 may include, for example, a biometric sensor module 211 (e.g., an HRM sensor) disposed on the second surface 210B of the housing 210. The electronic device 200 may further include at least one of sensor modules, such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

The key input device 202, the key input device 203, and the key input device 204 may include a wheel key 202 disposed on the first surface 210A of the housing 210 and configured to be rotatable in at least one direction, and/or side key button 203 and side key button 204 disposed on the side surface 210C of the housing 210. The wheel key 202 may have a shape corresponding to the shape of the front plate 201. In another embodiment, the electronic device 200 may not include some or all of the above-mentioned key input device 202, the key input device 203, and the key input device 204, and a non-included key input device 202, key input device 203, or key input device 204 may be implemented in another form, such as a soft key on the display 220. The connector hole 209 may accommodate a connector (e.g., a USB connector) configured to transmit/receive power and/or data to/from an external electronic device, and may include another connector hole capable of accommodating a connector configured to transmit/receive an audio signal to/from an external electronic device. The electronic device 200 may further include, for example, a connector cover, which covers at least a portion of the connector hole 209 and blocks inflow of external foreign matter into the connector hole.

The binding member 250 and the binding member 260 may be detachably bound to at least a portion of the housing 210 via locking member 251 and locking member 261. The binding member 250 and the binding member 260 may include one or more of a fixing member 252, fixing member fastening holes 253, a band guide member 254, and a band fixing ring 255.

The fixing member 252 may be configured to allow the housing 210 and the binding member 250 and the binding member 260 to be fastened to a portion of a user's body (e.g., a wrist or an ankle). The fixing member fastening holes 253 allow the housing 210 and the binding member 250 and the binding member 260 to be fastened to a portion of the user's body, corresponding to the fixing member 252. The band guide member 254 is configured to limit the movement range of the fixing member 252 when the fixing member 252 fits onto the fixing member fastening holes 253, thereby ensuring that the binding members 250 and the binding member 260 are brought into close contact with and bound to a portion of the user's body. The band fixing ring 255 may limit the movement range of the binding members 250 and 260 in the state in which the fixing member 252 and the fixing member fastening holes 253 are fastened to each other.

Figure 4:
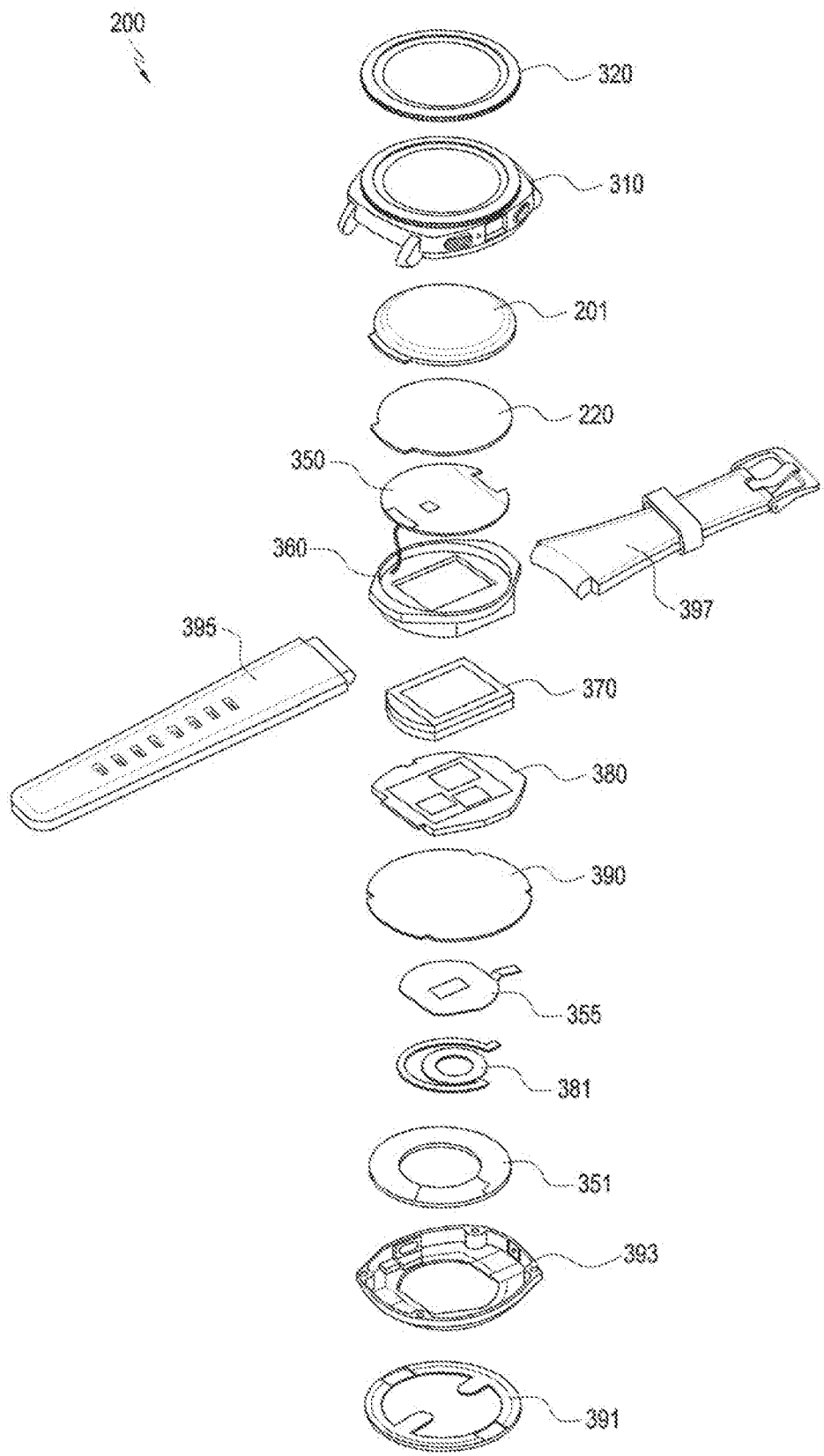
FIG. 4 is an exploded perspective view illustrating an electronic device according to embodiments of the disclosure.

FIG. 4 is an exploded perspective view illustrating an electronic device according to various embodiments of the disclosure.

Referring to FIG. 4, the electronic device 200 may include a side bezel structure 310, a wheel key 320, a front plate 201, a display 220, a first antenna 350, a second antenna 351, a sensor module 355, a support member 360 (e.g., a bracket), a battery 370, a printed circuit board 380 (e.g., the first printed circuit board), an auxiliary printed circuit board 381 (e.g., the second printed circuit board), a sealing member 390, a rear plate 393, a rear cover 391, and/or and binding member 395 and binding member 397. At least one of the components of the electronic device 200 may be the same as or similar to at least one of the components of the electronic device 200 of FIG. 1 or FIG. 2, and a redundant description thereof will be omitted below. The support member 360 may be disposed inside the electronic device 200 and connected to the side bezel structure 310, or may be integrally configured with the side bezel structure 310. The support member 360 may be formed of, for example, a metal material and/or a non-metal (e.g., polymer) material. The support member 360 may include one surface to which the display 220 is coupled and the other surface to which the printed circuit board 380 is coupled. On the printed circuit board 380 and auxiliary printed circuit board 381, a processor, a memory, and/or an interface may be mounted. The processor may include, for example, one or more of a central processing unit, an application processor, a graphic processing unit (GPU), an application processor sensor processor, or a communication processor.

According to various embodiments, the memory may include, for example, a volatile memory or a nonvolatile memory. The interface may include, for example, a high-definition multimedia interface (HDMI), a universal serial bus (USB) interface, an SD card interface, and/or an audio interface. The interface may electrically or physically connect, for example, the electronic device 200 to an external electronic device, and may include a USB connector, an SD card/an MMC connector, or an audio connector.

According to various embodiments, the side bezel structure 310 may function as an antenna of the electronic device 200. For example, a communication module (e.g., the communication module 190 of FIG. 1) may transmit a wireless signal to the outside by using the side bezel structure 310 or may receive a wireless signal from the outside. According to an embodiment, the side bezel structure 310 may be electrically connected to the communication module 190 located on the circuit board 380. According to an embodiment, the configuration of the side bezel structure 310 may be entirely or partially the same as the configuration of an antenna module (e.g., the antenna module 197 of FIG. 1).

According to various embodiments, the battery 370 is a device for supplying power to at least one component of the electronic device 200, and may include, for example, a non-rechargeable primary battery, a rechargeable secondary battery, or a fuel cell. At least a portion of the battery 370 may be disposed on substantially the same plane as, for example, the printed circuit board 380. The battery 370 may be integrally disposed inside the electronic device 200, or may be disposed to be detachable from the electronic device 200.

According to various embodiments, the first antenna 350 may be disposed between the display 220 and the support member 360. The first antenna 350 may include, for example, a near field communication (NFC) antenna, a wireless charging antenna, and/or a magnetic secure transmission (MST) antenna. In an embodiment (e.g., FIG. 4), the first antenna 350 may be an NFC antenna. For example, the first antenna 350 may perform short-range communication with an external device, may wirelessly transmit/receive power required for charging, or may transmit a short-range communication signal or a magnet-based signal including payment data. In another embodiment, an antenna structure may be formed by a portion of the side bezel structure 310 and/or a portion of the first support member 360, or a combination thereof.

According to various embodiments, the second antenna 351 may be disposed between the circuit board 380 and the rear plate 393. The second antenna 351 may include, for example, a near field communication (NFC) antenna, a wireless charging antenna, and/or a magnetic secure transmission (MST) antenna. In an embodiment (e.g., FIG. 4), the second antenna 351 may be a wireless charging antenna. For example, the second antenna 351 may perform short-range communication with an external device, may wirelessly transmit/receive power required for charging, or may transmit a short-range communication signal or a magnet-based signal including payment data. In another embodiment, an antenna structure may be formed by a portion of the side bezel structure 310 and/or a portion of the rear plate 393, or a combination thereof. According to various embodiments, the sealing member 390 may be located between the side bezel structure 310 and the rear plate 393. The sealing member 390 may be configured to block moisture and foreign matter flowing into the space surrounded by the side bezel structure 310 and the rear plate 393 from the outside.

According to various embodiments, the rear cover 391 may be located under the rear plate 393. At least a portion of the rear cover 391 may be exposed to the outside of the electronic device 200. The rear cover 391 may cover at least a portion of the sensor module 355 and/or the auxiliary printed circuit board 381.

Figure 5:
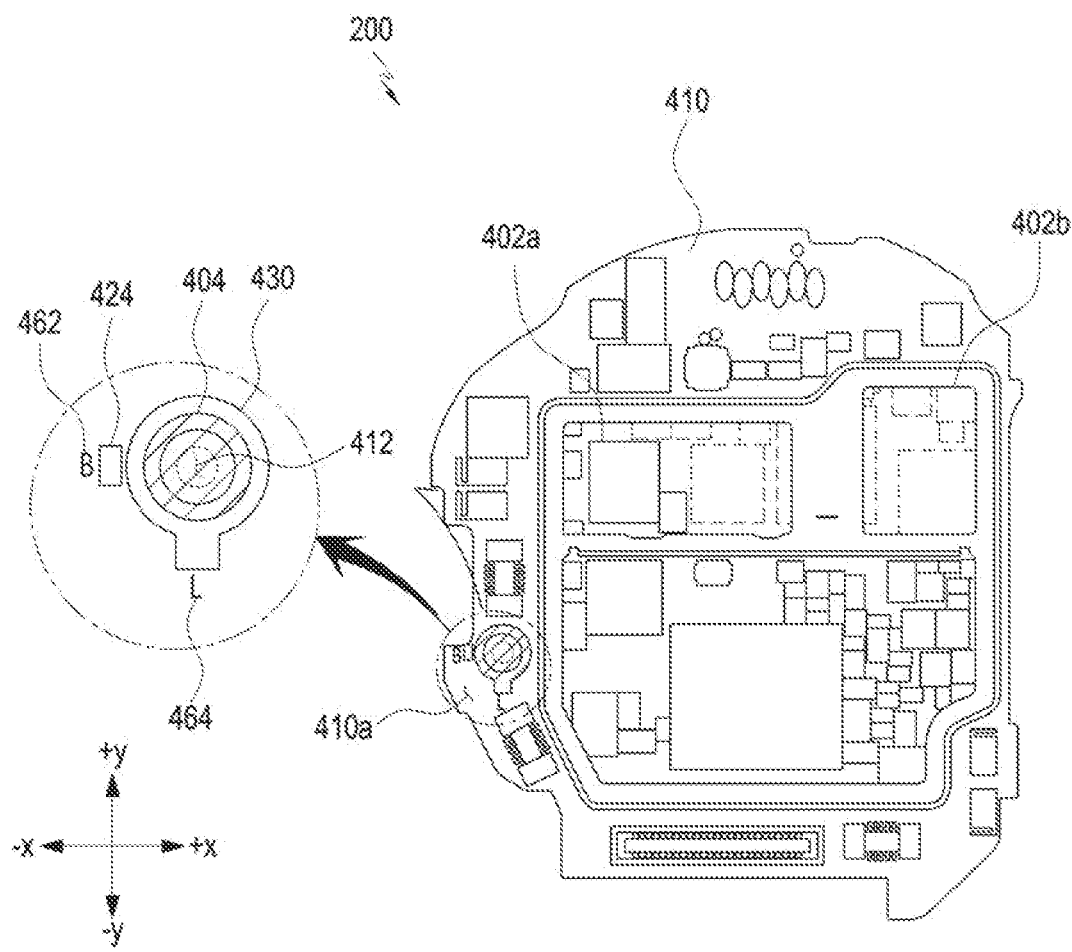
FIG. 5 is a top view illustrating a printed circuit board according to embodiments of the disclosure.
Figure 6:
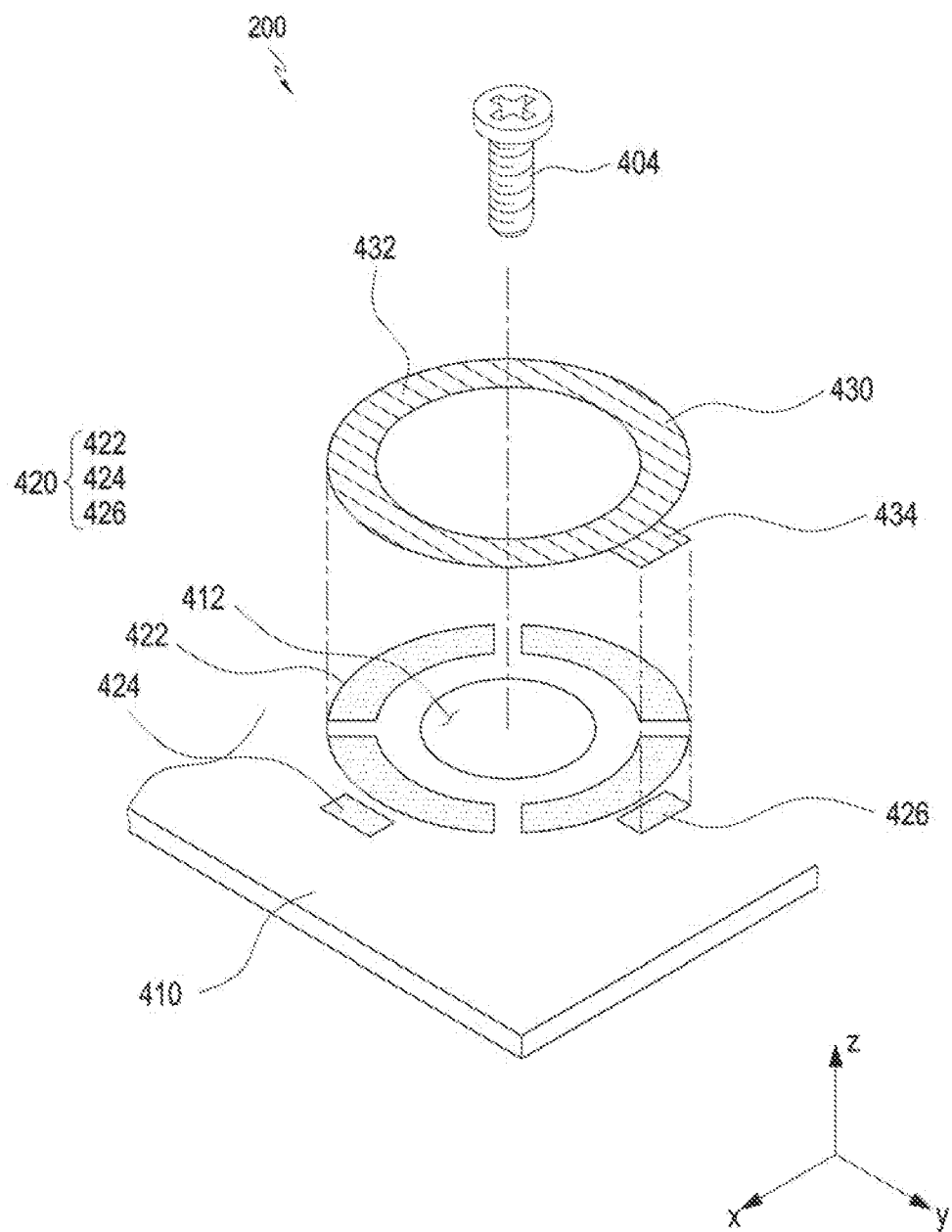
FIG. 6 is a view illustrating a connection between a printed circuit board, a pad structure, and a metal plate according to embodiments of the disclosure.
Figure 7:
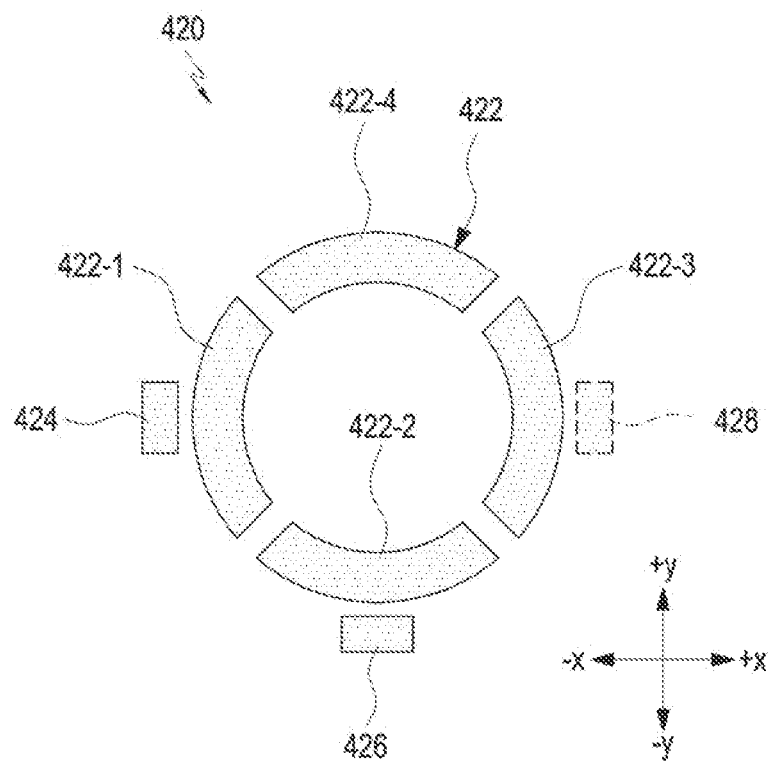
FIG. 7 is a top view illustrating a pad structure according to embodiments of the disclosure.
Figure 8:
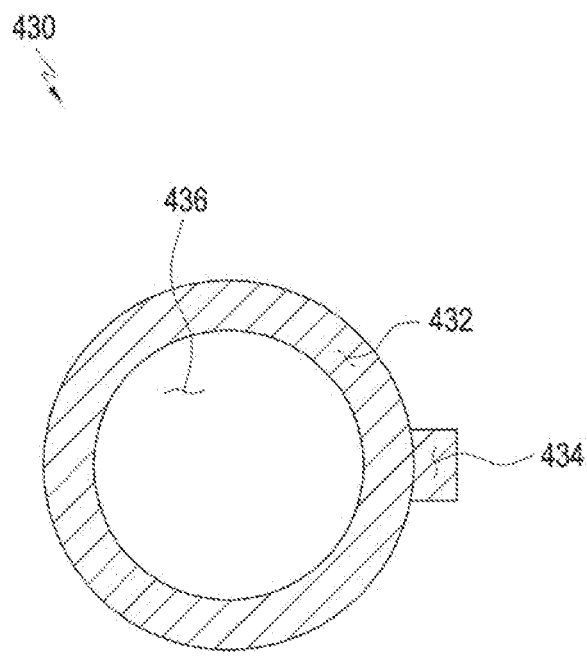
FIG. 8 is a top view illustrating a metal plate according to embodiments of the disclosure.

FIG. 5 is a view for illustrating a pad structure and a metal plate located on a printed circuit board according to various embodiments of the disclosure. FIG. 6 is a view illustrating a connection between a printed circuit board, a pad structure, and a metal plate according to various embodiments of the disclosure. FIG. 7 is a top view illustrating a pad structure according to various embodiments of the disclosure. FIG. 8 is a top view illustrating a metal plate according to various embodiment of the disclosure.

Referring to FIGS. 5 to 8, the electronic device 200 may include a printed circuit board 410, a pad structure 420, and a metal plate 430. The configuration of the printed circuit board 410 of FIG. 4 may be entirely or partially the same as that of the printed circuit board 380 of FIG. 3.

According to various embodiments, the electronic device 200 may include at least one communication module 402a or communication module 402b. According to an embodiment, the configuration of the communication module 402a and the communication module 402b may be entirely or partially the same as that of the communication module 190 of FIG. 1. According to an embodiment, the communication module 402a and the communication module 402b may be disposed on the printed circuit board 410. For example, the communication modules 402a and the communication module 402b may be disposed on the front surface 410a of the printed circuit board 410.

According to various embodiments, the electronic device 200 may include a first communication module 402a configured to communicate with an external electronic device of the electronic device 200 in a first frequency band. According to an embodiment, the first frequency band may be, for example, 2400-2480 MHz, and the first communication module 402a may be a Bluetooth module using a first network (e.g., the first network 198 of FIG. 1).

According to various embodiments, the electronic device 200 may include a second communication module 402b configured to communicate with an external electronic device of the electronic device 200 in a second frequency band, which is different from the first frequency band. According to an embodiment, the second frequency band may range from, for example, 800 to 2400 MHz, 2520 to 2660 MHz, or 3000 to 50000 MHz, and the second communication module 402b may be a band supporting cellular communication, such as a 4G communication module or a 5G communication module using a second network (e.g., the second network 199 of FIG. 1). According to an embodiment, the electronic device 200 may communicate with an external electronic device using at least one of the first communication module 402a or the second communication module 402b. According to an embodiment, the second communication module 402b may be excluded, and the electronic device 200 may communicate with an external electronic device using the first communication module 402a.

According to various embodiments, the printed circuit board 410 may be disposed in a housing (e.g., the housing 110 of FIG. 1). According to an embodiment, the printed circuit board 410 may be coupled to a support member (e.g., the support member 360 of FIG. 3) located inside the housing 210. For example, the printed circuit board 410 may include a fastening hole 412, and may be connected to the housing 110 and/or the support member 360 using a fastening member 404 that is at least partially located in the fastening hole 412. According to an embodiment, the fastening member 404 may have a screw structure or a boss structure. According to an embodiment, when the fastening member 404 is located in the fastening hole 412, at least a portion of the fastening member 404 may be surrounded by the metal plate 430.

Figure 9:
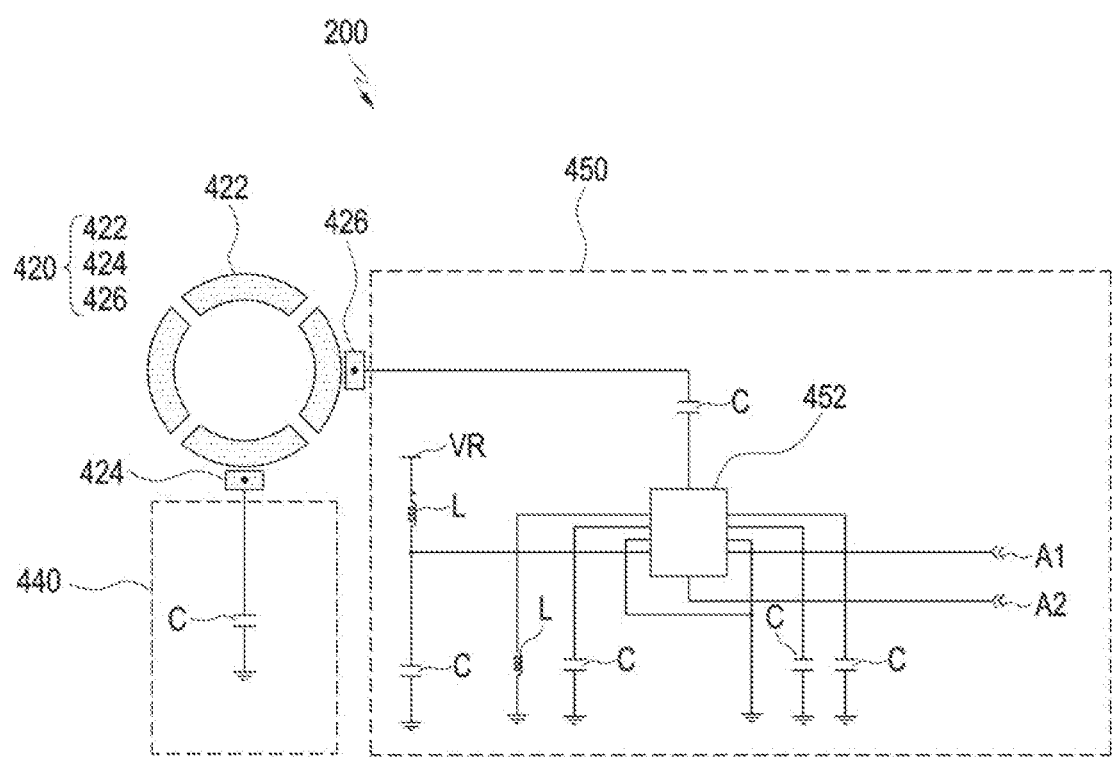
FIG. 9 is a circuit diagram of an electronic device including a pad structure electrically connected to a first electronic component and a second electronic component according to embodiments of the disclosure.

According to various embodiments, the pad structure 420 may be electrically connected to an electronic component (e.g., the first electronic component 440 and/or the second electronic component 450 of FIG. 9). According to an embodiment, the pad structure 420 may be a contact pad or a bond pad. According to an embodiment, the pad structure 420 may include a conductive metal. For example, the pad structure 420 may include at least one of copper, stainless steel, or aluminum. According to an embodiment, the pad structure 420 may be a conductive region. According to an embodiment, the pad structure 420 may be formed or disposed on the front surface 410a of the printed circuit board 410. For example, the pad structure 420 may be interpreted as at least a portion of the conductive region exposed to the outside of the printed circuit board 410, excluding the protective layer of the printed circuit board 410. According to an embodiment, the pad structure 420 may be electrically coupled to another component using an alloy (e.g., solder) including at least one of tin (Sn) or lead (Pb).

According to various embodiments, the pad structure 420 may include a plurality of pads (e.g., the first pad 422, the second pad 424, the third pad 426, and/or the fourth pad 428). According to an embodiment, the pad structure 420 may include a first pad 422 surrounding at least a portion of the fastening hole 412, a second pad 424 spaced apart from the first pad 422, and a third pad 426 spaced apart from the first pad 422 in a different direction from the second pad 424. For example, the third pad 426 may be located in a different direction from the second pad 424 with respect to the fastening hole 412. For example, the second pad 424 may be located in a first direction (−x direction) with respect to the fastening hole 412, and the third pad 416 may be located in a second direction (e.g., −y direction) perpendicular to the first direction with respect to the fastening hole 412. According to an embodiment, the second pad 424 may be electrically connected to a first electronic component (e.g., the first electronic component 440 of FIG. 9), and the third pad 426 may be electrically connected to a second electronic component (e.g., the second electronic component 450 of FIG. 9), which is different from the first electronic component 440. For example, the first electronic component 440 may be at least one electronic element electrically connected to the first communication module 402a, and the second electronic component 450 may be at least one electronic element electrically connected to the second communication module 402b. According to an embodiment, the pad structure 420 may include a fourth pad 428 spaced apart from the first pad 422. The fourth pad 428 may be located in a different direction from the second pad 424 and/or the third pad 426 with respect to the fastening hole 412. According to an embodiment, the fourth pad 428 may be connected to a third electronic component, which is different from the first electronic component 440 or the second electronic component 450. The third electronic component may be interpreted as an electronic element for tuning a third communication module using a third frequency band, which is different from the first frequency band of the first communication module 402a or the second frequency band of the second communication module 402b. According to an embodiment, the second pad 424, the third pad 426, and/or the fourth pad 428 may be formed in various shapes and/or sizes.

According to an embodiment, the first pad 422 may include a plurality of first pads 422-1, 422-2, 422-3, and 422-4. For example, the first pad 422 may include at least one of a (1-1)th pad 422-1, a (1-2)th pad 422-2, a (1-3)th pad 422-3, or a (1-4)th pad 422-4, which are spaced-apart from each other. The spaced-apart arrangement of the (1-1)th pad 422-1, the (1-2)th pad 422-2, the (1-3)th pad 422-3, and the (1-4)th pad 422-4 allows for easy boding (soldering) between the first pad 422 and the printed circuit board 410. According to an embodiment, the shapes and/or sizes of the (1-1)th pad 422-1, the (1-2)th pad 422-2, the (1-3)th pad 422-3, and/or the (1-4)th pad 422-4 may be variously formed.

According to various embodiments, the metal plate 430 may distribute pressure between the pad structure 420 and the fastening member 404. According to an embodiment, the metal plate 430 may be disposed on the pad structure 420. For example, the metal plate 430 may be disposed between the fastening member 404 and the pad structure 420. According to an embodiment, at least a portion (e.g., the first plate area 432) of the metal plate 430 may be interpreted as a washer.

According to various embodiments, the metal plate 430 may include a first plate area 432 and a second plate area 434. According to an embodiment, the first plate area 432 may be disposed on the first pad 422. For example, at least a portion of the first plate area 432 may be located between the first pad 422 and the fastening member 404. According to an embodiment, the second plate area 434 may extend from the first plate area 432. The second plate area 434 may be disposed on the second pad 424 or the third pad 426. For example, the second plate area 434 may cover the second pad 424 or the third pad 426. According to an embodiment, the second plate area 434 may be interpreted as a protruding area protruding in one direction from the first plate area 432. According to an embodiment, at least a portion of the metal plate 430 may be formed in a closed loop shape. For example, the first plate area 432 may be formed in a circular or polygonal shape, surrounding an inner space 436 for accommodating the fastening member 404. According to an embodiment, the inner space 436 of the first plate area 432 may have a larger shape than a fastening hole (e.g., the fastening hole 412 of FIG. 5).

According to various embodiments, the electronic device 200 may include display member 462 and display member 264. According to an embodiment, the display member 462 and the display member 464 may be visually exposed to the outside of the printed circuit board 410. According to an embodiment, the display member 462 and the display member 464 may include a first display member 462 adjacent to the second pad 424 and a second display member 464 adjacent to the third pad 426. According to an embodiment, the shape of the first display member 462 and the shape of the second display member 464 may differ. For example, the first display member 462 may have a "B" shape, while the second display member 464 may have an "L" shape. According to an embodiment, the display member 462 and the display member 464 may be formed on the printed circuit board 410 using a screen.

According to various embodiments, the metal plate 430 may visually provide information on a component (e.g., the first communication module 402a and/or the second communication module 402b) mounted on the printed circuit board 410. For example, the metal plate 430 may be located on the second pad 424 or the third pad 426 based on a component (e.g., the first communication module 402a and/or the second communication module 402b) included in the electronic device 200, and the user or manufacturer of the electronic device 200 may recognize the component (e.g., the first communication module 402a and/or the second communication module 402b) located on the printed circuit board 410 based on the location where the metal plate 430 is disposed. According to an embodiment (e.g., FIG. 5), in the electronic device 200 including a second electronic component (e.g., the second electronic component 450 of FIG. 9) for operating the second communication module 402b, the second plate area 434 may be disposed on the third pad 426. When the electronic device 200 includes the second communication module 402b, the second plate area 434 may be disposed to face the second display member 464. According to an embodiment, in an electronic device that does not include the second communication module 402b, the second plate area 434 may be located on the second pad 424. When the electronic device 200 does not include the second communication module 402b, the second plate area 434 may be disposed to face the first display member 462.

FIG. 9 is a circuit diagram of an electronic device including a pad structure electrically connected to a first electronic component and a second electronic component according to various embodiments of the disclosure.

Referring to FIG. 9, the electronic device 200 may include at least one of a pad structure 420, a first electronic component 440, or a second electronic component 450. The configuration of the pad structure 420 of FIG. 9 may be entirely or partially the same as the configuration of the pad structure 420 of FIG. 5.

According to various embodiments, the first electronic component 440 may be electrically connected to a first communication module (e.g., the first communication module 402a of FIG. 5). According to an embodiment, the first electronic component 440 may include at least one electronic element (e.g., the capacitor C) and/or a ground, and may adjust an electrical signal transmitted and/or received by the first communication module 402a. Due to such a first electronic component 440, the communication performance of the first communication module 402a in the first frequency band may be improved. According to an embodiment, the first electronic component 440 may be disposed on a printed circuit board (e.g., the printed circuit board 410 of FIG. 5). According to an embodiment, the first electronic component 440 may be electrically connected to the second pad 424. According to an embodiment, the first electronic component 440 may be interpreted as at least a part of the first communication module (e.g., the first communication module 402a of FIG. 5).

According to various embodiments, the first electronic component 440 may be electrically connected to a metal plate (e.g., the metal plate 430 of FIG. 8) through the second pad 424. According to an embodiment, the metal plate 430 (e.g., the first plate area 432) may be an area that is electrically connected to an antenna (e.g., the side bezel structure 310 of FIG. 4). According to an embodiment, the first plate area 432 of the metal plate 430 may be located on the first pad 422, and the second plate area 434 may be located on the second pad 424. The first electronic component 440 may be electrically connected to the first plate area 432 using solder for coupling the second pad 424, the second plate area 434, and/or the pad structure 420. According to an embodiment, by connecting the first electronic component 440 to the conductive metal plate 430, the performance of the first communication module 402a may be improved.

According to various embodiments, the second electronic component 450 may be electrically connected to the second communication module (e.g., the second communication module 402b of FIG. 5). According to an embodiment, the second electronic component 450 may include at least one electronic element (e.g., the capacitor C or the inductance L) as well as a voltage regulator VR and/or voltage V, and may regulate electrical signals generated by the second communication module 402b. Owing to the second electronic component 450, the performance of communication in the second frequency band of the second communication module 402b may be improved (e.g., noise reduction). According to an embodiment, the second electronic component 450 may include at least one antenna (e.g., the side bezel structure 310, a first antenna A1, and/or a second antenna A2), and may transmit or receive electrical signals (e.g., wireless signals) generated by the second communication module 402b to/from the outside of the electronic device 200. According to an embodiment, the second electronic component 450 may include at least one electronic element (e.g., the capacitor C or the inductance L) and a switch 452 electrically connected to the at least one antenna (e.g., the side bezel structure 310, the first antenna A1, and/or the second antenna A2) and including a plurality of ports. Each of the plurality of ports may be connected to a circuit in which different electronic elements (e.g., the capacitor C and/or the inductance L) are disposed. According to an embodiment, the circuit electrically connected to the pad structure 420 may be changed using the switch 452 based on the frequency band. According to an embodiment, the second electronic component 450 may be interpreted as at least a part of the second communication module 402b. According to an embodiment, the second electronic component 450 may be excluded from the electronic device 200. For example, when the electronic device 200 does not include the second communication module 402b, the second electronic component 450 may be omitted.

According to various embodiments, the second electronic component 450 may be disposed on a printed circuit board (e.g., the printed circuit board 410 of FIG. 5). According to an embodiment, the second electronic component 450 may be electrically connected to the third pad 426.

According to various embodiments, the second electronic component 450 may be electrically connected to a metal plate (e.g., the metal plate 430 of FIG. 8) through the third pad 426. According to an embodiment (e.g., the embodiment of FIG. 5), the first plate area 432 of the metal plate 430 may be located on the first pad 422, and the second plate area 434 may be located on the third pad 426. The second electronic component 450 may be electrically connected to the first plate area 432 using solder for coupling the third pad 426, the second plate area 434, and/or the pad structure 420. According to an embodiment, by connecting the second electronic component 450 to the conductive metal plate 430, the performance of the second communication module (e.g., the second communication module 402b of FIG. 5) may be improved.

According to various embodiments, the second electronic component 450 may be located to be spaced from the first electronic component 440 by a designated distance. For example, a printed circuit board (e.g., the printed circuit board 410 of FIG. 5) may include a plurality of substrate layers, and the layer of the printed circuit board 410 where the second electronic component 450 is located may differ from the layer of the printed circuit board where the first electronic component 440 is located. As the first electronic component 440 is connected to the second pad 424, and the second electronic component 450 is connected to the third pad 426, which is spaced apart from the second pad 424, it is possible to reduce or exclude a stub line on the printed circuit board (e.g., the printed circuit board 410 of FIG. 5). For example, by excluding the wiring shared by the first electronic component 440 and the second electronic component 450, the stub line may be reduced or excluded. By reducing or excluding the stub signal, deterioration of communication performance of the electronic device 200 may be reduced or prevented.

According to various embodiments of the disclosure, an electronic device (e.g., the electronic device 200 of FIG. 2) may include a housing (e.g., the housing 210 of FIG. 2); a printed circuit board (e.g., the printed circuit board 410 of FIG. 5) disposed in the housing and including a fastening hole (e.g., the fastening hole 412 of FIG. 5); a pad structure (e.g., the pad structure 420 of FIG. 6) disposed on the printed circuit board and including a first pad (e.g., the first pad 422 of FIG. 6) surrounding at least a portion of the fastening hole, a second pad (e.g., the second pad 424 of FIG. 6) spaced apart from the first pad, and a third pad (e.g., the third pad 426 of FIG. 6) spaced apart from the first pad in a different direction from the second pad with respect to the fastening hole; a first electronic component (e.g., the first electronic component 440 of FIG. 9) disposed on the printed circuit board and electrically connected to the second pad; and a metal plate (e.g., the metal plate 430 of FIG. 8) including a first plate area (e.g., the first plate area 432 of FIG. 8) disposed on the first pad; and a second plate area (e.g., the second plate area 434 of FIG. 8) extending from the first plate area and disposed on the second pad or the third pad.

According to various embodiments, the electronic device may further include a first communication module (e.g., the first communication module 402a of FIG. 5) electrically connected to the first electronic component and configured to communicate with the outside of the electronic device in a first frequency band.

According to various embodiments, the second plate area may be bonded to the second pad, and the metal plate may be electrically connected to the first electronic component.

According to various embodiments, the electronic device may further include a second electronic component (e.g., the second electronic component 450 of FIG. 9) disposed on the printed circuit board and electrically connected to the third pad, and a second communication module (e.g., the second communication module 402b of FIG. 5) configured to communicate with the outside of the electronic device in a second frequency band, which is different from the first frequency band.

According to various embodiments, the second plate area may be bonded to the third pad, and the metal plate may be electrically connected to the second electronic component.

According to various embodiments, the electronic device may further include a side bezel structure (e.g., the side bezel structure 310 of FIG. 4) electrically connected to the metal plate.

According to various embodiments, the pad structure may include a fourth pad (e.g., the fourth pad 428 of FIG. 6) spaced apart from the first pad in a different direction from the second pad or the third pad with respect to the fastening hole.

According to various embodiments, the first pad area may include a (1-1)th pad (e.g., the (1-1)th pad 422-1 of FIG. 6), a (1-2)th pad (e.g., the (1-2)th pad 422-2 of FIG. 6), a (1-3)th pad (e.g., the (1-3)th pad 422-3 of FIG. 6), and a (1-4)th pad (e.g., the (1-4)th pad 422-4 of FIG. 6), which are spaced apart from each other.

According to various embodiments, the first plate area may be formed in a closed curve shape, and the second plate area may protrude in one direction from the first metal plate area.

According to various embodiments, the printed circuit board may include a display member (e.g., the display member 462 and the display member 464 of FIG. 5) that is visually exposed to the outside of the printed circuit board, and that includes a first display member (e.g., the display member 462 of FIG. 5) adjacent to the second pad, and a second display member (e.g., the display member 464 of FIG. 5) that is adjacent to the third pad and different from the first display sign.

According to various embodiments, the metal plate may include at least one of stainless steel or aluminum.

According to various embodiments, the electronic device may further include a fastening member (e.g., the fastening member 404 of FIG. 5) at least partially located in the fastening hole, and at least a portion of the fastening member may be surrounded by the metal plate.

According to various embodiments, at least a portion of the metal plate may be disposed between the fastening member and the pad structure.

According to various embodiments, the electronic device may further include a display (e.g., the display 220 of FIG. 4), and a support member (e.g., the support member 360 of FIG. 4) that is disposed in the housing and located between the display and the printed circuit board, wherein the printed circuit board may be connected to the support member using the fastening member. According to various embodiments, the electronic device may further include at least one binding member (e.g., the binding member 250 and the binding member 260 of FIG. 2) detachably connected to the housing.

According to various embodiments of the disclosure, an electronic device (e.g., the electronic device 200 of FIG. 2) may include a housing (e.g., the housing 210 of FIG. 2); at least one binding member (e.g., the binding members 250 and the binding member 260 of FIG. 2) detachably connected to the housing; a support member (e.g., the support member 360 of FIG. 4) disposed in the housing; a printed circuit board (e.g., the printed circuit board 410 of FIG. 5) disposed on the support member; a pad structure disposed on the printed circuit board and including a first pad (e.g., the first pad 422 of FIG. 6), a second pad (e.g., the second pad 424 of FIG. 6) spaced apart from the first pad, and a third pad (e.g., the third pad 426 of FIG. 6) spaced apart from the first pad in a different direction from the second pad with respect to the first pad; and a metal plate (e.g., the metal plate area 430 of FIG. 8) including a first plate area (e.g., the first plate area 432 of FIG. 8) disposed on the first pad and a second plate area (e.g., the second plate area 434 of FIG. 8) extending from the first plate area and configured to cover the second pad or the third pad.

According to various embodiments, the electronic device may further include a first electronic component (e.g., the first electronic component 450 of FIG. 9) disposed on the printed circuit board and electrically connected to the second pad, and a first communication module (e.g., the first communication module 402*a* of FIG. 5) electrically connected to the first electronic component and configured to communicate with the outside of the electronic device in a first frequency band.

According to various embodiments, the electronic device may further include a second electronic component (e.g., the second electronic component 450 of FIG. 9) disposed on the printed circuit board and electrically connected to the third pad, and a second communication module (e.g., the second communication module 402*b* of FIG. 5) configured to communicate with the outside of the electronic device in a second frequency band, which is different from the first frequency band.

According to various embodiments, the second plate area may be bonded to the third pad, and the metal plate may be electrically connected to the second electronic component.

According to various embodiments, the first plate area may be formed in a closed curve shape, and the second plate area may protrude in one direction from the first metal plate area.

It will be apparent to one of ordinary skill in the art that electronic devices including the discoloration member according to the disclosure as described above is not limited to the embodiments described above and shown in the drawings, and various changes, modifications, or alterations may be made thereto without departing from the scope of the disclosure.

What is claimed is:

1. An electronic device comprising:
a housing;
a printed circuit board provided in the housing and comprising a fastening hole;
a pad structure provided on the printed circuit board, the pad structure comprising:
a first pad surrounding at least a portion of the fastening hole;
a second pad spaced apart from the first pad in a first direction; and
a third pad spaced apart from the first pad in a second direction that is different from the first direction with respect to the fastening hole;
a first electronic component provided on the printed circuit board and electrically connected to the second pad; and
a metal plate comprising:
a first plate area provided on the first pad; and
a second plate area extending from the first plate area and provided on one of the second pad and the third pad.

2. The electronic device of claim 1, further comprising a first communication module electrically connected to the first electronic component and configured to communicate, in a first frequency band, with an outside of the electronic device.

3. The electronic device of claim 1, wherein the second plate area is bonded to the second pad, and
wherein the metal plate is electrically connected to the first electronic component.

4. The electronic device of claim 2, further comprising:
a second electronic component provided on the printed circuit board and electrically connected to the third pad; and
a second communication module configured to communicate, in a second frequency band, with the outside of the electronic device, wherein the second frequency band is different from the first frequency band.

5. The electronic device of claim 4, wherein the second plate area is bonded to the third pad, and
wherein the metal plate is electrically connected to the second electronic component.

6. The electronic device of claim 1, further comprising a side bezel structure electrically connected to the metal plate.

7. The electronic device of claim 1, wherein the pad structure comprises a fourth pad spaced apart from the first pad in a third direction that is different from the first direction and the second direction with respect to the fastening hole.

8. The electronic device of claim 1, wherein the first pad comprises a (1-1)th pad, a (1-2)th pad, a (1-3)th pad, and a (1-4)th pad, which are spaced apart from each other.

9. The electronic device of claim 1, wherein the first plate area has a closed curve shape, and
wherein the second plate area protrudes from the first plate area.

10. The electronic device of claim 1, wherein the printed circuit board comprises a display member visually exposed to an outside of the printed circuit board, and
wherein the display member comprises:
a first display member adjacent to the second pad; and
a second display member adjacent to the third pad.

11. The electronic device of claim 1, wherein the metal plate comprises at least one of stainless steel and aluminum.

12. The electronic device of claim 1, further comprising a fastening member at least partially disposed in the fastening hole,
wherein at least a portion of the fastening member is surrounded by the metal plate.

13. The electronic device of claim 12, wherein at least a portion of the metal plate is between the fastening member and the pad structure.

14. The electronic device of claim 12, further comprising:
a display; and
a support member provided in the housing and between the display and the printed circuit board,
wherein the printed circuit board is connected to the support member by the fastening member.

15. The electronic device of claim 1, further comprising at least one binding member detachably connected to the housing.

* * * * *